(12) United States Patent
Kim

(10) Patent No.: US 8,441,068 B2
(45) Date of Patent: May 14, 2013

(54) SEMICONDUCTOR DEVICE AND METHOD FOR FORMING THE SAME

(75) Inventor: Seung Wan Kim, Icheon (KR)

(73) Assignee: Hynix Semiconductor Inc., Icheon (KR)

(*) Notice: Subject to any disclaimer, the term of this patent is extended or adjusted under 35 U.S.C. 154(b) by 132 days.

(21) Appl. No.: 13/176,377

(22) Filed: Jul. 5, 2011

(65) Prior Publication Data

US 2012/0007172 A1    Jan. 12, 2012

(30) Foreign Application Priority Data

Jul. 6, 2010    (KR) .................. 10-2010-0064824

(51) Int. Cl.
*H01L 29/78* (2006.01)
(52) U.S. Cl.
USPC ............ 257/330; 257/E21.473; 257/E29.255; 438/566
(58) Field of Classification Search .................. 257/286, 257/330
See application file for complete search history.

(56) References Cited

U.S. PATENT DOCUMENTS

| 6,218,701 | B1 | 4/2001 | Semple et al. |
| 7,052,999 | B2* | 5/2006 | Lee et al. ............ 438/706 |
| 2001/0002327 | A1 | 5/2001 | Semple et al. |
| 2004/0084746 | A1* | 5/2004 | Kim et al. ............ 257/503 |
| 2010/0044797 | A1 | 2/2010 | Lee |

FOREIGN PATENT DOCUMENTS

| JP | 2009-099712 A | 5/2009 |
| KR | 1020010014813 A | 2/2001 |

* cited by examiner

*Primary Examiner* — David Vu
*Assistant Examiner* — Jonathan Han

(57) ABSTRACT

A semiconductor device and a method for forming the same are disclosed. The semiconductor device includes an active region formed to be sloped or tilted by $\alpha°$ (where $0°<\alpha°<90°$) from the bottom of a semiconductor substrate, at least one gate that is formed over the sloped active region and has a surface parallel to the bottom of the semiconductor substrate, and a landing plug that is coupled to the active region and is located between the gates. As a result, the area of the active region is increased thus increasing a channel width, so that the operation of the semiconductor device can be improved as the integration degree of the semiconductor device is rapidly increased.

18 Claims, 8 Drawing Sheets

# SEMICONDUCTOR DEVICE AND METHOD FOR FORMING THE SAME

CROSS-REFERENCE TO RELATED APPLICATION

The priority of Korean patent application No. 10-2010-0064824 filed on 6 Jul. 2010, the disclosure of which is hereby incorporated in its entirety by reference, is claimed.

BACKGROUND OF THE INVENTION

Embodiments of the present invention relate to a semiconductor device, and more particularly to a semiconductor device and a method for forming the same.

The electronic industry has recently been intensively focused on the development of a method for manufacturing a highly-integrated semiconductor device. In order to implement a highly-integrated semiconductor device, fabrication technology for a semiconductor substrate has been rapidly changing to improve technology for fabricating a more-miniaturized semiconductor substrate. Therefore, a semiconductor device design rule, serving as an indicator as to how many separate elements can be formed on a limited-sized semiconductor substrate, has become more strict. In accordance with the design rule, the more a pattern minimizes, the narrower the distance between respective patterns becomes and the more precise pattern shape must be.

As a semiconductor device becomes super miniaturized and highly integrated, the design rule of the semiconductor device is gradually reduced, so that a channel length of a Metal Oxide Semiconductor Field Effect Transistor (MOSFET) becomes shorter. The reduced channel length causes the distance between a source region and a drain region to be reduced, thereby causing a short channel effect (SCE). As a result, it is difficult to effectively control the influence of a drain-region voltage on a source-region voltage and a channel-region voltage, and thus characteristics of an active switch are unavoidably deteriorated. In addition, when the distance between the source region and the drain region is very close, the punch-through influence between the source and drain.

In order to solve the above-mentioned problems, a Recessed Field Effect Transistor (FET) structure, in which a semiconductor substrate is recessed and a gate electrode is formed to bury the recessed semiconductor substrate so that an effective channel length is increased, has been proposed. The recessed FET structure improves the source and drain punch-through phenomena by substantially increasing the distance between the source and drain regions.

However, the recess gate is disadvantageous in that it is difficult to control a threshold voltage (Vt). Thus the threshold voltage (Vt) is reduced and a leakage current occurs in an OFF state. In order to control the threshold voltage (Vt), impurity ions such as boron (B) need to be implanted. However, such additional impurity ion implantation causes the electric field of a device to increase, and thus device refresh characteristics are deteriorated.

In addition, the semiconductor substrate is deeply etched to form a recess gate, which deteriorates gate control function due to an increased body effect and results in deterioration of swing characteristics. Furthermore, device characteristics deteriorate because of a neighbor gate effect between neighboring recess gates.

BRIEF SUMMARY OF THE INVENTION

Various embodiments of the present invention are directed to providing a semiconductor device and a method for forming the same that substantially obviate one or more problems due to limitations and disadvantages of the related art.

An embodiment of the present invention relates to a semiconductor device and a method for forming the same, which can solve the problems of the related art in which the width and length of a channel are reduced due to the highly-integrated semiconductor device such that characteristics of the semiconductor device are unavoidably deteriorated.

In accordance with an aspect of the present invention, a semiconductor device includes an active region formed sloped by $\alpha°$ (where $0°<\alpha°<90°$) with respect to the bottom of a semiconductor substrate, a gate formed in the sloped active region and having a surface parallel to the bottom of the semiconductor substrate and a landing plug coupled to the active region at a side of the gate.

The gate may include a recess gate.

The gate may include a gate polysilicon; a gate electrode formed over the gate polysilicon; and a hard mask formed over the gate electrode.

The gate polysilicon is formed in the sloped active region in such a manner that the surface of the gate polysilicon is arranged parallel to the bottom of the semiconductor substrate while the bottom of the gate polysilicon is sloped with respect to the bottom of the semiconductor substrate.

The gate hard mask is formed over the gate electrode in such a manner that the surface of the hard mask is arranged parallel to the bottom of the semiconductor substrate while the bottom of the hard mask is sloped with respect to the bottom of the semiconductor substrate.

The semiconductor device may further include a junction region contained in the active region at both sides of the gate, and coupled to the landing plug.

The active region may include a first end and a second end formed at a higher level than that of the first end.

The gate may be formed to a greater depth at the first end than at the second end.

In accordance with another aspect of the present invention, a method for forming a semiconductor device includes forming an active region sloped by $\alpha°$ (where $0°<\alpha°<90°$) with respect to the bottom of a semiconductor substrate, forming a gate that is formed in the sloped active region and has a surface parallel to the bottom of the semiconductor substrate and forming a landing plug that is coupled to the active region at a side of the gate.

The forming of the sloped active region may include tilting the semiconductor substrate by an angle of $(90-\alpha)°$ with respect to a ground surface and implanting an etching solution from a direction perpendicular to the ground surface.

the forming of the sloped active region is performed by an anisotropic etching process using an etch selection ratio of the semiconductor substrate and a device isolation film.

The forming of the sloped active region may be performed by an anisotropic etching process using an etch selection ratio related to a device isolation film.

The method may further include, after forming the sloped active region, forming a recess in the sloped active region.

The forming of the recess may include etching the active region to the same thickness from the surface of the sloped active region, thereby forming the recess.

The forming of the gate may include forming a gate polysilicon in the sloped active region in such a manner that the surface of the gate polysilicon is arranged parallel to the bottom of the semiconductor substrate while the bottom of the gate polysilicon is sloped with respect to the bottom of the semiconductor substrate, forming a gate electrode over the gate polysilicon, forming a hard mask over the gate electrode, forming a photoresist pattern defining the gate over the hard mask, patterning the hard mask, the gate electrode, and the gate polysilicon using the photoresist pattern as a mask.

The forming of the gate may include forming a gate polysilicon in the sloped active region, forming a gate electrode over the gate polysilicon, forming a hard mask over the gate electrode in such a manner that the surface of the hard mask is arranged parallel to the bottom of the semiconductor substrate while the bottom of the hard mask is sloped with respect to the bottom of the semiconductor substrate, forming a photoresist pattern defining the gate over the hard mask and patterning the hard mask, the gate electrode, and the gate polysilicon using the photoresist pattern as a mask.

The method may further include, after forming the gate, implanting ions into the active region located at sides of the gate, and forming a junction region in the active region.

The forming of the landing plug may include forming an interlayer insulation film over the semiconductor substrate including the gate, forming an island-type photoresist pattern defining the active region over the interlayer insulation film, etching the interlayer insulation film using the island-type photoresist pattern as a mask to form a contact hole exposing the active region, forming a landing plug conductive layer in the contact hole and performing a planarization etching process on the landing plug conductive layer until the gate surface is exposed.

The forming of the landing plug includes forming an interlayer insulation film over the semiconductor substrate including the gate; forming a photoresist pattern defining a junction region over the interlayer insulation film; etching the interlayer insulating film using the island-type photoresist pattern as a mask to form a contact hole exposing the junction region; forming a landing plug conductive layer in the contact hole; and performing a planarization etching process on the landing plug conductive layer until the gate surface is exposed.

DESCRIPTION OF EMBODIMENTS

Reference will now be made in detail to the embodiments of the present invention, examples of which are illustrated in the accompanying drawings. Wherever possible, the same reference numbers will be used throughout the drawings to refer to the same or like parts.

One embodiment of the present invention enlarges an active region to prevent deterioration of a highly-integrated semiconductor device, such that the channel area is increased. Preferably, the active region may be extended through a sloped etching process using an etch selection ratio from a device isolation film. A detailed description of the sloped etching process will hereinafter be described with reference to FIG. 1.

Referring to FIG. 1(i), it is preferable that the sloped etching process be carried out while tilting a semiconductor substrate 100 on its side by some degrees. Preferably, implantation of the etching solution (E) may be performed perpendicular to the ground surface (S) while tilting the semiconductor substrate 100 on its side some degrees. Preferably, the etching solution (E) may spin off with a specific angle)($\alpha°$ against the surface of the semiconductor substrate 100. That is, the semiconductor substrate 100 is tilted at an angle (i.e., a slope of)$(90-\alpha)°$ with respect to the ground (S).

Figure 1:
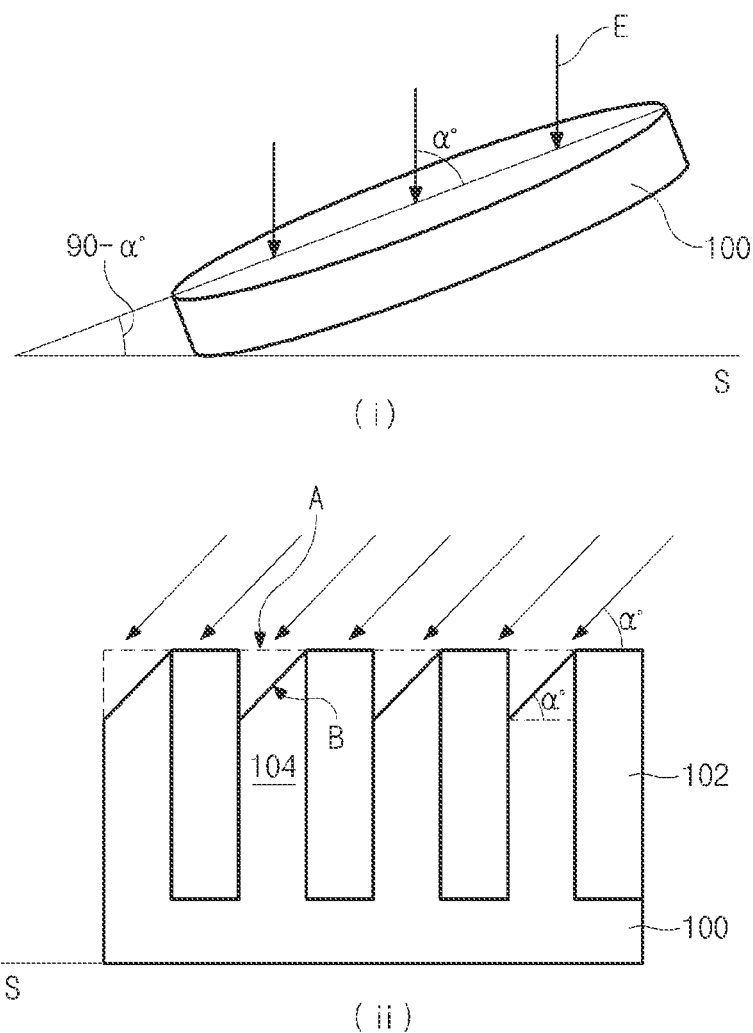
FIG. 1(i) is a perspective view and FIG. 1(ii) is a cross-sectional view illustrating a sloped etching process according to an embodiment of the present invention.

Referring to FIG. 1(ii), in the case where a semiconductor substrate 100 and the ground (S) are located at the same surface, the etching solution (E) is configured to spin off with an angle of $\alpha°$ against the surface of the semiconductor substrate 100. The etching solution (E) is applied to a region reserved to be an active region 104. In this case, it is preferable that the active region 104 be formed by an anisotropic etching process using the etch selection ratio difference between a device isolation film 102 and the semiconductor substrate 100. Therefore, the surface (B) of the active region 104 is not in parallel to the surface of the device isolation film 102, and is tilted by a predetermined angle of $\alpha°$ with respect to the bottom of the semiconductor substrate 100. A comparison of the active region surface according to the related art will hereinafter be described in detail.

Figure 2:
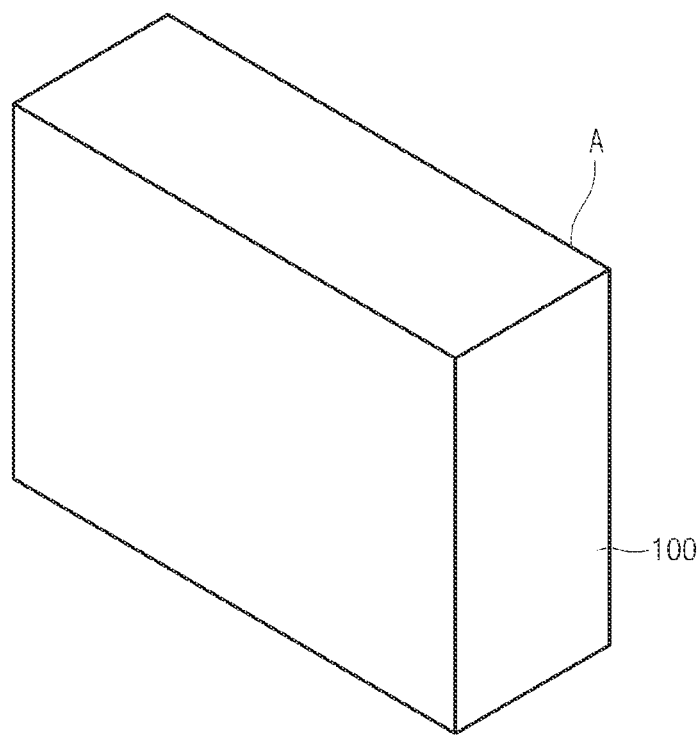
FIG. 2 is a perspective view illustrating an active region according to related art.

Referring to FIG. 2, the active region surface (A) according to the related art is parallel to the bottom of the semiconductor substrate 100. Therefore, the active region surface (A), formed according to the related art, has the same area as the bottom of the semiconductor substrate 100.

Figure 3:
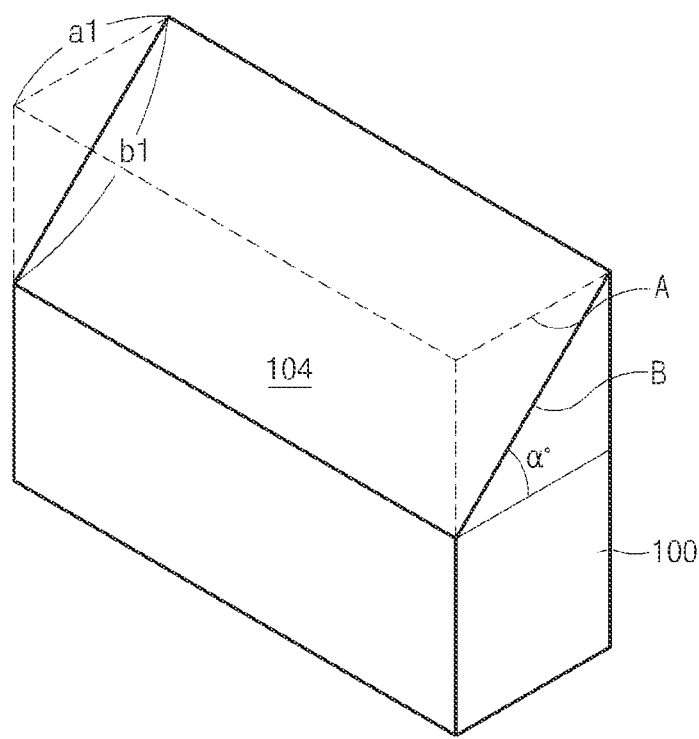
FIG. 3 is a perspective view illustrating an active region according to an embodiment of the present invention.

Referring to FIG. 3, the active region surface (B) formed according to one embodiment of the present invention is tilted by $\alpha°$ with respect to the bottom of the semiconductor substrate 100 so that the surface area is larger than the active region surface (A) of the related art. That is, the side (b1) of the active region surface (B) of the present invention is longer than the side (a1) of the active region surface (A) of the related art according to the Pythagorean theorem, so that the active region surface (B) of the present invention is larger in width than the active region surface (A) of the related art. Since, in this case, the side (b1) determines the width of the active region 104, the channel width of the present invention can be formed larger than that of the related art.

Preferably, the sloped angle of $\alpha°$ with which the etching solution is applied to the substrate is in the range from 0° to 90° (i.e., $0°<\alpha°<90°$). If $\alpha°$ is set to 45°, the side (b1) has the highest value, so that the active region surface (B) of the present invention has the largest size, which is larger than the active region surface (A) of the related art by 1.4 times.

As described above, the semiconductor device including the sloping-etched active region according to the present invention is as follows.

Figure 4:
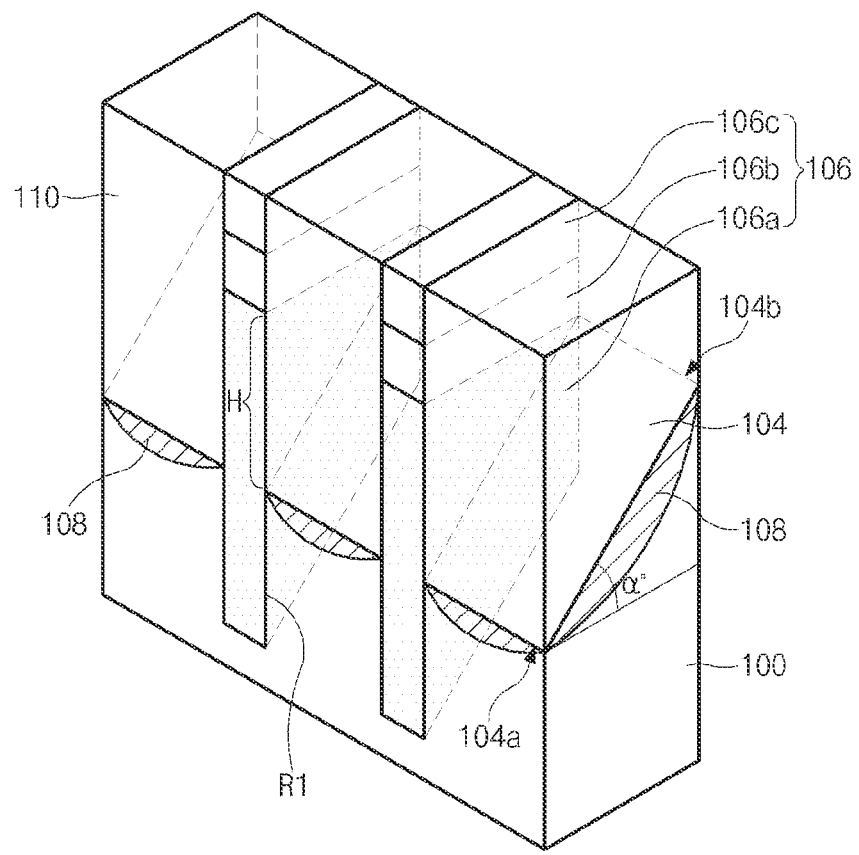
FIG. 4 is a perspective view of a semiconductor device according to an embodiment of the present invention.

Referring to FIG. 4, the semiconductor device according to an embodiment of the present invention includes an active region 104 that is sloped or tilted by an angle of $\alpha°$ with respect to the bottom of the semiconductor substrate 100; a recess R1 formed in the sloped active region 104; a gate 106 formed in the recess R1 such that the surface of the gate 106 is parallel to the bottom of the semiconductor substrate 100; and a landing plug 110 coupled to the active region 104 and located between the gates 106. Preferably the gate 106 may include a gate polysilicon 106a, a gate electrode formed over the gate polysilicon 106b and a hard mask formed over the gate electrode 106c. The semiconductor device may further include a spacer insulating layer (not shown) formed a sidewall of gate 106. The junction regions 108 are adjacent to the gate 106 and may be formed at the same level measured from the surface of the active region 104.

Preferably, α° is greater than 0° and is less than 90°. More preferably, α° may be set to 45°. When α° is 45°, the surface area of the active region 104 is the largest and a sufficient channel area is guaranteed, resulting in improved operation characteristics of the semiconductor device. In addition, the recess R1 formed in the active region 104 may be used to define the recess gate according to one embodiment of the present invention. The recess R1 is not always necessary for the semiconductor device of the present invention, and may be omitted by forming a planar gate.

The gate 106 further extends higher from a lower end 104a of the recess R1 than from a higher end 104b by a predetermined depth H. Therefore, the top surface of the gate 106 is arranged parallel to the bottom of the semiconductor substrate 100.

In order to make the surface of the gate 106 parallel to the bottom of the semiconductor substrate 100, the gate polysilicon layer 106a can be formed to be deeper at the lower end 104a of the recess R1 than at the higher end 104b of the recess R1 by a predetermined depth 20 of 'H' as shown in FIG. 4.

A method for forming A semiconductor device according to an embodiment of the present invention will hereinafter be described with reference to the attached drawings.

Figure 5A:
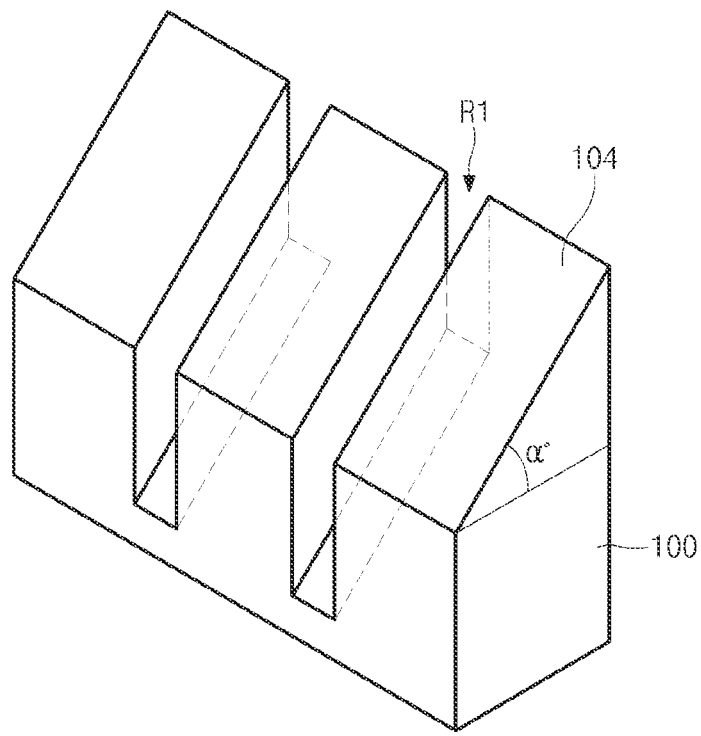
FIGS. 5A to 5D are perspective views illustrating a method for forming a semiconductor device according to an embodiment of the present invention.

Referring to FIG. 5A, the active region 104, defined by a device isolation film (not shown), is formed in the semiconductor substrate 100, so as to be tilted by an angle of α° with respect to the bottom of the semiconductor substrate 100, and is sloping-etched. During the sloped etching process, the semiconductor substrate 100 may be configured to rotate while being tilted by an angle of (90-α)° (i.e., a slope of)(90-α)° with respect to the ground, and implantation of the etching solution may be applied to the semiconductor substrate 100 from the direction perpendicular to the ground. In this case, it is preferable that the sloped etching process performs an anisotropic etching process using an etch selection ratio difference between the substrate and the device isolation film (not shown).

Preferably, α° may be in the range from 0° to 90° (i.e., 0°<α°<90°).) More preferably, α° may be set to 45°. When α° is set to 45°, the surface area of the active region 104 is the largest and the channel area is maximized, resulting in improved operation characteristics of the semiconductor device.

Subsequently, a photoresist pattern (not shown) for defining a recess is formed over the sloped active region 104, and the active region 104 is then etched using the photoresist pattern as a mask, so that the recess R1 is formed. Preferably, the recess R1 may be etched to the same depth from the surface of the active region 104. Therefore, an angle between the bottom of the recess R1 and the bottom of the semiconductor substrate 100 is set to α°. In accordance with embodiments of the present invention, a recess gate should be construed as only one example, and the present invention can be applied to a planar gate structure, a buried gate structure, etc.

Although not shown in the drawings, it is preferable that ion implantation for adjusting a voltage (Vt) of the recess gate be performed on the surface of the active region 104. In order to form the ion implantation region at the same height from the surface of the sloped active region 104, the ion implantation process may be performed at a sloped angle.

Figure 5B:
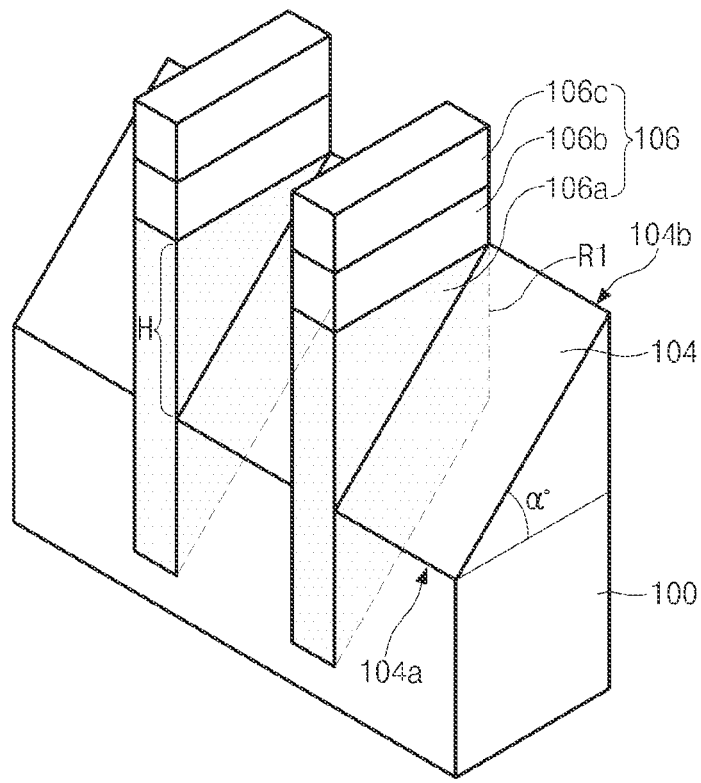

Referring to FIG. 5B, the gate oxide film (not shown) is formed over the active region 104 including the recess R1, and a gate polysilicon 106a is deposited over the entire part.

It is preferable that the gate polysilicon 106a be formed to a greater height at a lower end of the recess R1 than at the higher end of the recess R1. The gate polysilicon 106a initially formed over the active region 104 including the recess R1 may have a depth of 2000 to 5000. Thereafter, a planarization etching process is performed using the device isolation film (not shown) as a mask in such a manner that the surface of the gate polysilicon 106a is arranged parallel to the bottom of the semiconductor substrate 100.

The gate polysilicon 106a, after the planarization etching process, is formed to a greater depth in the lower end 104a of the recess R1 than that in the higher end 104b of the recess R1 by a predetermined depth of H. In this way, the gate polysilicon 106a is formed to compensate for the reduced height H caused by the sloped active region 104.

As described above, provided that the gate polysilicon 106a is formed to a sufficient depth to compensate for the reduced height H caused by the sloped active region 104, it is possible to form a gate structure over the device isolation film (not shown) without experiencing any difficulty due to the sloped active region 104 since the surface of the gate polysilicon 106a is arranged parallel to the bottom of the semiconductor substrate 100.

Subsequently, the gate electrode 106b is formed over the gate polysilicon 106a, and the hard mask 106c is formed over the gate electrode 106b and is then patterned so that the recess gate 106 is completed. The surface of the recess gate 106 is arranged parallel to the bottom of the semiconductor substrate 100, while the bottom of the recess gate 106 is sloped along the sloped active region 104. Thus, the gate is easily formed despite the sloped active region. Under this structure, even if the semiconductor device is highly integrated, a large channel area can be obtained and thus improving operation characteristics of the semiconductor device.

Figure 5C:
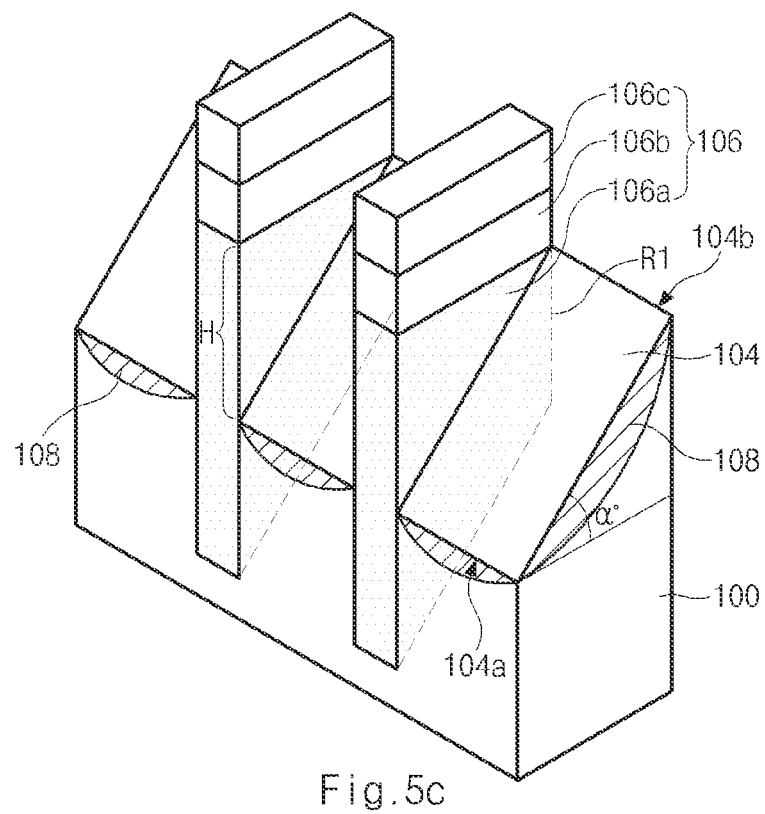

Referring to FIG. 5C, ion implantation is performed on the surface of the active region 104 using the recess gate 106 as a mask, so that the junction regions 108 are formed. Preferably, the junction regions 108 are adjacent to the recess gate 106 and may be formed at the same level measured from the surface of the active region 104. Preferably, in order to form the junction regions 108 at the same level measured from the surface of the active region 104, the ion implantation process may be performed at an angle. A spacer insulating layer (not shown) is formed a sidewall of the recess gate 106.

Figure 5D:
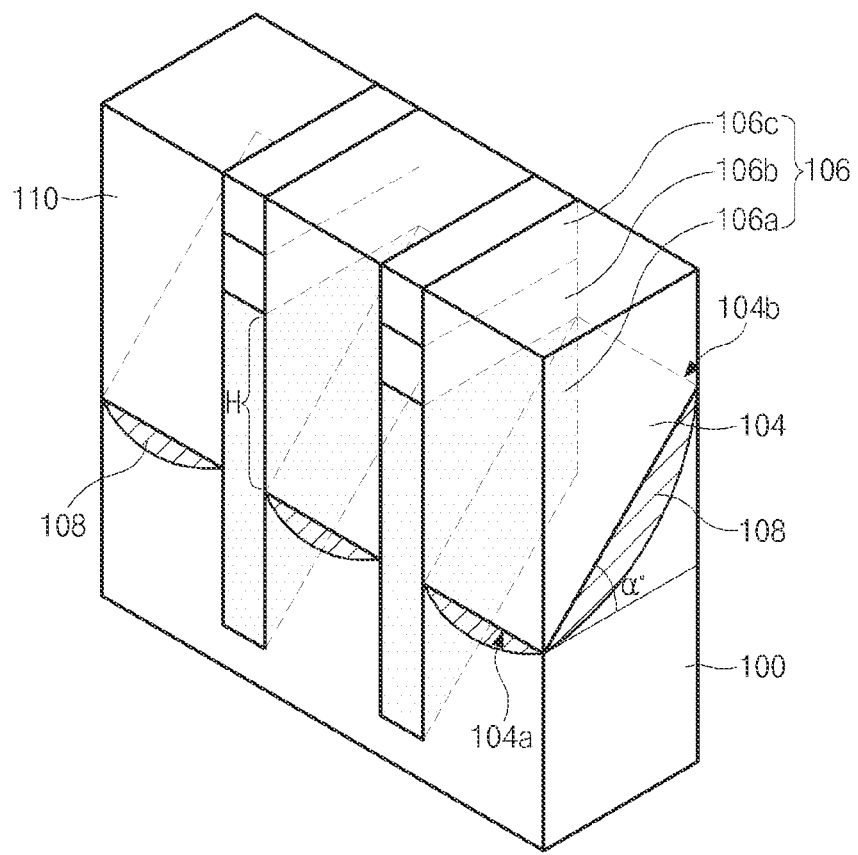

Referring to FIG. 5D, an interlayer insulation film (not shown) is formed over the semiconductor substrate 100 in such a manner that the recess gate 106 is buried with the interlayer insulation film. A photoresist pattern (not shown) for defining a landing plug is formed over the interlayer insulation film, and the interlayer insulation film is etched using the photoresist pattern as a mask. In this case, the landing plug defined by the photoresist pattern may be a hole pattern or an island pattern.

The interlayer insulation film over the junction region is etched using the photoresist pattern as a mask, the landing plug conductive layer is filled in the opened active region 104, and a planarization etching process is performed to expose the gate hard mask 106c, so that a landing plug 110 coupled to the junction region may be formed between recess gates 106.

However, during the planarization etching process, if the hard mask 106c is not sufficiently planarized to expose the hard mask 106c and the neighboring landing plugs are bridged with each other, the interlayer insulation film is etched using the photoresist pattern including holes as a mask so that the active region is open, and thus the landing plug 110 is formed by burying the landing plug conductive layer in the opened region.

The method for forming the semiconductor device according to the above embodiment of the present invention results in the gate polysilicon having a depth that compensates for the sloped height of the active region. The above-mentioned method for forming the semiconductor device according to an embodiment of the present invention is disclosed as one example of a method for compensating for the height of the sloped active region. However, another method may also be used to compensate for the sloped active region without departing from the scope or spirit of the present invention. A detailed description thereof will hereinafter be described with reference to a method of another embodiment of the present invention.

Figure 6A:
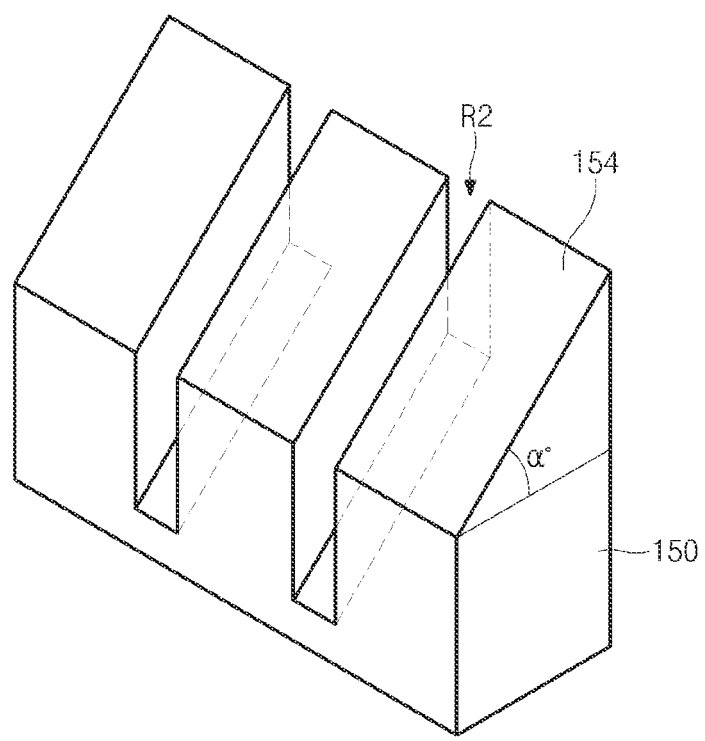
FIGS. 6A to 6D are perspective views illustrating a method for forming a semiconductor device according to another embodiment of the present invention.

Referring to FIG. 6A, an active region 154, defined by a device isolation film (not shown), in the semiconductor substrate 150 is sloping-etched, so that the active region 154 is tilted by an angle of α° with respect to the bottom of the semiconductor substrate 150. A detailed description of the sloped etching process will hereinafter be described with reference to FIGS. 6A and 6D.

A photoresist pattern (not shown) for defining a recess is formed over the sloped active region 154, and the active region 154 is etched using the photoresist pattern as a mask, so that the recess R2 is formed. In this case, the recess R2 will hereinafter be described in comparison with the recess R1 shown in FIG. 5A.

Figure 6B:
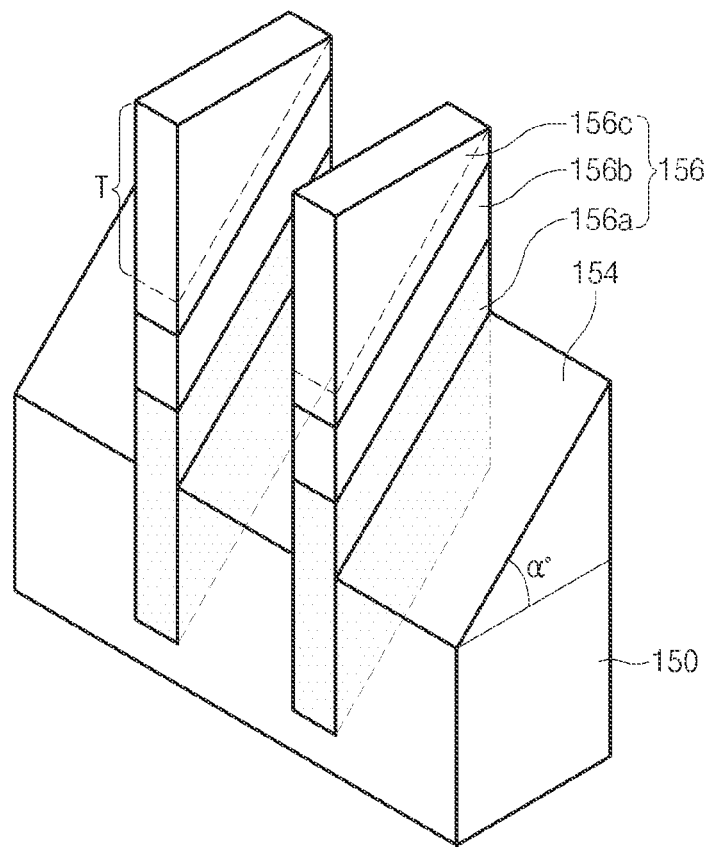

Referring to FIG. 6B, a gate oxide film (not shown) is formed over the active region 154 including the recess R2. A gate polysilicon 156a is formed to fill the recess, and the gate electrode 156b is formed over the gate polysilicon 156a. A hard mask 156c is formed over the gate electrode 156b and then patterned, so that the recess gate 156 is completed.

Preferably, the hard mask 156c may be formed to have a larger depth by T at a lower end of the sloped active region 154 than that at a higher end of the sloped active region 154 in such a manner that the reduced height (See 'H' of FIG. 5B) caused by the sloped active region 154 is compensated for. Therefore, the surface of the hard mask 156c is arranged parallel to the bottom of the semiconductor substrate 150 while the bottom of the recess gate 156 is arranged tilted in parallel to the surface of the sloped active region 154. Thus, the gate can be easily formed irrespective of the sloped active region. Also, the surface area of the active region 154 may be leveled off so that subsequent element can be easily formed. Thus, the channel area is easily guaranteed even in a highly-integrated semiconductor device, so that operation characteristics of the semiconductor device are improved. As a result, there is no difficulty in forming a gate over the device isolation film (not shown) that is formed parallel to the bottom of the semiconductor substrate 150 in the same manner as in an embodiment of the present invention as shown in FIGS. 5A to 5D.

Figure 6C:
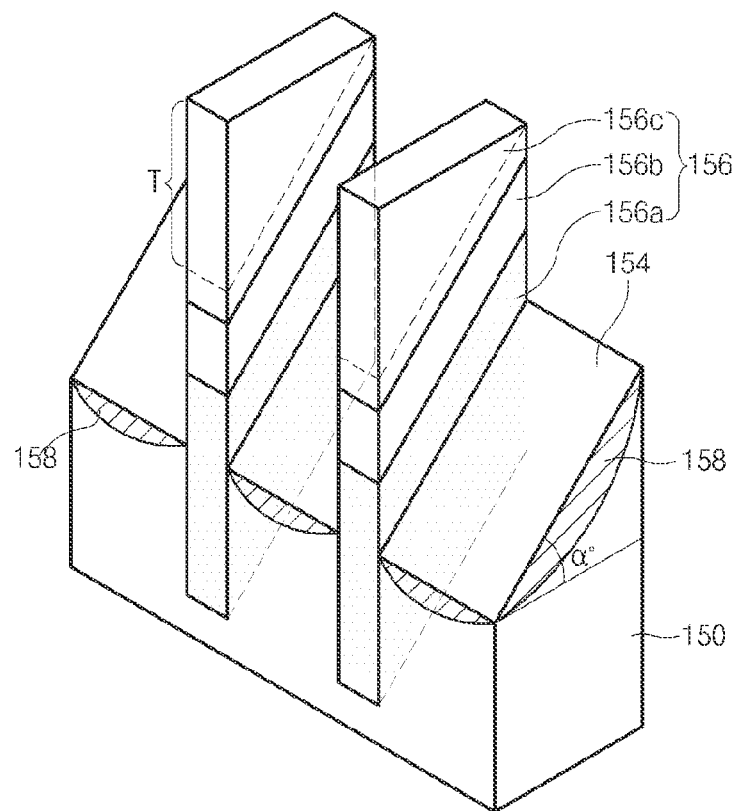

Referring to FIG. 6C, ion implantation is performed on the surface of the active region 154 using the recess gate 156 as a mask, so that the junction region 158 is formed. In this case, it is preferable that the junction region 158 be formed to the same depth from the surface of the active region 154. In order to enable the junction region 158 to be formed to the same depth from the surface of the active region 154, the ion implantation process may be performed at an angle. A spacer insulating layer (not shown) is formed a sidewall of the recess gate 156.

Figure 6D:
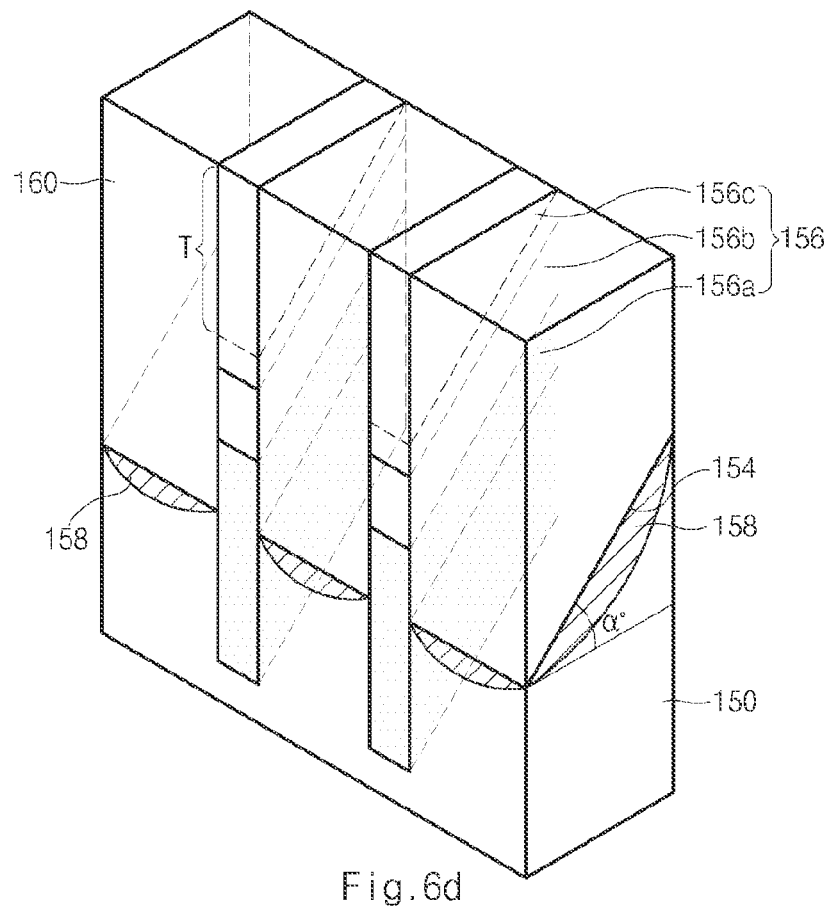

Referring to FIG. 6D, an interlayer insulation film (not shown) is formed over the semiconductor substrate 150 in such a manner that the active region 154 exposed between the recess gates 156 is covered. A photoresist pattern (not shown) for defining a landing plug is formed over the interlayer insulation film, the interlayer insulation film is etched using the photoresist pattern as a mask so as to form a landing plug contact hole. Conductive material fills in the landing plug contact hole to form a landing plug conductive layer, and a planarization etching process is performed on the landing plug conductive layer, so that the landing plug 160 is formed. The landing plug 160 may be formed in different ways depending on the shape of the photoresist pattern (not shown) as described in FIG. 5D.

As is apparent from the above description, in accordance with a method for forming the semiconductor device according to embodiments of the present invention, the active region is formed to have a sloped surface, the surface area of the active region is increased, and the channel area is increased, so that characteristics of the semiconductor device can be improved.

The above embodiments of the present invention are illustrative and not limitative. Various alternatives and equivalents are possible. The invention is not limited by the embodiments described herein. Nor is the invention limited to any specific type of semiconductor device. Other additions, subtractions, or modifications are obvious in view of the present disclosure and are intended to fall within the scope of the appended claims.

What is claimed is:

1. A semiconductor device comprising:
   an active region formed sloped by α° (where 0°<α°<90°) with respect to the bottom of a semiconductor substrate;
   a gate formed in the sloped active region and having a surface parallel to the bottom of the semiconductor substrate; and
   a landing plug coupled to the active region at a side of the gate.

2. The semiconductor device according to claim 1, wherein the gate includes a recess gate.

3. The semiconductor device according to claim 1, the device further comprising:
   a junction region formed in the active region at a side of the gate, and coupled to the landing plug.

4. The semiconductor device according to claim 1, wherein the active region includes:
   a first end; and
   a second end formed at a higher level than that of the first end.

5. The semiconductor device according to claim 4, wherein the gate is formed to a greater depth at the first end than at the second end.

6. The semiconductor device according to claim 1, wherein the gate includes:
   a gate polysilicon;
   a gate electrode formed over the gate polysilicon; and
   a hard mask formed over the gate electrode.

7. The semiconductor device according to claim 6, wherein the gate polysilicon is formed in the sloped active region in such a manner that the surface of the gate polysilicon is arranged parallel to the bottom of the semiconductor substrate while the bottom of the gate polysilicon is sloped with respect to the bottom of the semiconductor substrate.

8. The semiconductor device according to claim 6, wherein the gate hard mask is formed over the gate electrode in such a manner that the surface of the hard mask is arranged parallel to the bottom of the semiconductor substrate while the bottom of the hard mask is sloped with respect to the bottom of the semiconductor substrate.

9. A method for forming a semiconductor device comprising:
   forming an active region sloped by α° (where 0°<α°<90°) with respect to the bottom of a semiconductor substrate;

forming a gate that is formed in the sloped active region and has a surface parallel to the bottom of the semiconductor substrate; and forming a landing plug that is coupled to the active region at a side of the gate.

10. The method according to claim 9, wherein the forming of the sloped active region includes:

tilting the semiconductor substrate by an angle of $(90-\alpha)°$ with respect to a ground surface; and applying an etching solution from a direction perpendicular to the ground surface.

11. The method according to claim 9, wherein the forming of the sloped active region includes:

applying an etching solution at an angle of $\alpha°$ with the respect to the surface of the semiconductor substrate.

12. The method according to claim 9, wherein the forming of the sloped active region is performed by an anisotropic etching process using an etch selection ratio of the semiconductor substrate and a device isolation film.

13. The method according to claim 9, the method further comprising:

after forming the sloped active region, forming a recess in the sloped active region.

14. The method according to claim 13, wherein the forming of the recess includes:

etching the active region to the same thickness from the surface of the sloped active region, thereby forming the recess.

15. The method according to claim 9, wherein the forming of the gate includes:

forming a gate polysilicon in the sloped active region in such a manner that the surface of the gate polysilicon is arranged parallel to the bottom of the semiconductor substrate while the bottom of the gate polysilicon is sloped with respect to the bottom of the semiconductor substrate;

forming a gate electrode over the gate polysilicon;

forming a hard mask over the gate electrode;

forming a photoresist pattern defining the gate over the hard mask; and patterning the hard mask, the gate electrode, and the gate polysilicon using the photoresist pattern as a mask.

16. The method according to claim 9, wherein the forming of the gate includes:

forming a gate polysilicon in the sloped active region;

forming a gate electrode over the gate polysilicon;

forming a hard mask over the gate electrode in such a manner that the surface of the hard mask is arranged parallel to the bottom of the semiconductor substrate while the bottom of the hard mask is sloped with respect to the bottom of the semiconductor substrate;

forming a photoresist pattern defining the gate over the hard mask; and patterning the hard mask, the gate electrode, and the gate polysilicon using the photoresist pattern as a mask.

17. The method according to claim 9, the method further comprising:

implanting ions into the active region located at sides of the gate, and forming a junction region in the active region.

18. The method according to claim 9, wherein the forming of the landing plug includes:

forming an interlayer insulation film over the semiconductor substrate including the gate;

forming a photoresist pattern defining a junction region over the interlayer insulation film;

etching the interlayer insulation film using the island-type photoresist pattern as a mask to form a contact hole exposing the junction region;

forming a landing plug conductive layer in the contact hole; and performing a planarization etching process on the landing plug conductive layer until the gate surface is exposed.

* * * * *